(12) United States Patent
Chung et al.

(10) Patent No.: US 6,525,896 B2
(45) Date of Patent: *Feb. 25, 2003

(54) METHOD AND CIRCUITRY FOR HIGH VOLTAGE APPLICATION WITH MOSFET TECHNOLOGY

(75) Inventors: Paul Wingshing Chung, San Jose, CA (US); David Anthony Freitas, Morgan Hill, CA (US); Kevin Roy Vannorsdel, San Jose, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/078,847

(22) Filed: May 14, 1998

(65) Prior Publication Data

US 2002/0057512 A1 May 16, 2002

(51) Int. Cl.[7] .............................. G11B 5/02; G11B 5/09
(52) U.S. Cl. .......................... 360/68; 360/46; 327/110
(58) Field of Search .............................. 360/66, 67, 61; 327/420, 404, 405, 110

(56) References Cited

U.S. PATENT DOCUMENTS

| | | | | |
|---|---|---|---|---|
| 4,900,955 A | | 2/1990 | Kurpan | 327/306 |
| 5,612,828 A | * | 3/1997 | Brannon et al. | 360/46 |
| 5,822,141 A | * | 10/1998 | Chung et al. | 360/46 |
| 5,986,832 A | * | 11/1999 | Barrett | 360/46 |
| 6,388,476 B1 | * | 5/2002 | Isobe et al. | 327/110 |

FOREIGN PATENT DOCUMENTS

EP      0 043 489      1/1982

* cited by examiner

Primary Examiner—Regina N. Holder
(74) Attorney, Agent, or Firm—Altera Law Group, LLC

(57) ABSTRACT

A method and apparatus for high voltage applications, with the latest MOSFET technology having limited terminal-to-terminal voltage capability, includes a switch circuit having at least two serially coupled MOSFETs and a two-stage MOSFET connection using a plurality of resistors, and/or a bipolar transistor, and a plurality of diodes. One of the high voltage applications is a high speed write driver in a computer disk drive. The switch circuit switches on/off between zero volt and a voltage higher than a maximum terminal-to-terminal voltage of a single MOSFET which is typically five volts. A required voltage in high voltage applications can be in excess of, for example, 8 or 9 volts.

7 Claims, 6 Drawing Sheets

METHOD AND CIRCUITRY FOR HIGH VOLTAGE APPLICATION WITH MOSFET TECHNOLOGY

BACKGROUND OF THE INVENTION

1. Field of the Invention

This invention relates in general to integrated circuits, and in particular, to a method and apparatus for a high voltage switch circuit.

2. Description of Related Art

In many applications, MOSFET technology is being used to increase the speed, to reduce chip sizes, and to minimize power dissipation, etc. More and more applications require using MOSFET based technology. One concern related to implementing in most of today's MOSFET based technology is that the MOSFET transistors are limited in terminal-to-terminal voltage to 5 volts or less. In addition, to achieve faster speeds and higher integration, the terminal-to-terminal voltages on the MOSFET transistors will continue to decrease. But, there continues to be circuit applications requiring high voltages in excess of, for example, 8 volts, that are designed using MOSFET technology, such as a high speed write driver in a computer disk drive.

A typical write driver is designed using bipolar NPN devices with greater than 5 volt breakdown voltages. But in order to turn on and off the write driver, a switch is needed which disconnects the write driver from a high voltage and forces the output terminals of the write driver to ground. In this disconnected state, no power must be dissipated by the write driver.

In previous and existing write drivers, a high voltage switch was designed using either a PNP or PFET device. In either case, the switching device needed to operate at voltages above 5 volts. However, with the faster MOSFET based technologies, the use of a PNP device that was once practical for this application is generally no longer available and the faster MOSFET devices are limited to less than 5 volt in their terminal-to-terminal voltage.

The previous and existing voltage sharing circuits, such as the one disclosed in U.S. Pat. No. 4,900,955, have described the use of low voltage FETs to obtain high voltage outputs by using a stack of FET devices connected in series with the drain electrode of one FET connected to the source electrode of the next FET in the stack. However, none of the previous and existing voltage sharing circuits provide or teach the switch functions in a high voltage application with MOSFET technology, such as in a write driver circuit of a disk drive. Furthermore, none of the previous and existing voltage sharing circuits disclose or teach the use of a bipolar transistor to control bias to diodes and stacked FETs.

Therefore, there is a need for a high voltage switch to provide a high voltage switch function in the write driver circuit of a disk drive which is designed with the latest MOSFET technology having low terminal-to-terminal voltages.

There is also a need to have a method and apparatus suitable for high voltage applications which are designed with the latest MOSFET technology having limited terminal-to-terminal voltage capability.

SUMMARY OF THE INVENTION

To overcome the limitations in the prior art described above, and to overcome other limitations that will become apparent upon reading and understanding the present specification, the present invention discloses a method and apparatus for a high voltage application, and in particular, to a method and apparatus for a high voltage application with MOSFET technology.

In general, the present invention solves the above-described problems by including at least two serially coupled MOSFETs and a two-stage MOSFET connection using a plurality of resistors, and/or a bipolar transistor, and a plurality of diodes.

One of the high voltage applications of the present invention is the writing of data onto a disk in a disk drive. In one embodiment, a high voltage write driver in the Arm Electronics (AE) chip requires a high voltage switch to turn on and off the high voltage to the write driver. The technology used in the AE chip has a maximum terminal-to-terminal voltage of the MOSFET transistors of 5 volts. However, the switch circuitry is required to switch a voltage in excess of, for example, 8 or 9 volts. When the switch is on, the output of the switch applies the high voltage to the write driver. When off, the switch output switches to ground forcing the output of the write driver to the ground which turns off all power in both the write driver and the voltage switch.

A further aspect of the one embodiment of the present invention is a high voltage switch using a technology that has a maximum terminal-to-terminal voltage for MOSFET transistors of less than 5 volts, such as 3.3 or 2.5 volts, etc., yet still requiring voltage levels on the switch that are greater than the terminal-to-terminal voltage of the MOSFETs.

The present invention provides a switch circuitry capable of providing an output voltage between ground and the High Voltage (HV) power supply which is higher than the maximum terminal-to-terminal voltage of the MOSFET transistor. In one embodiment, the switch circuitry includes at least a first PFET and a second PFET. The first PFET has a source coupled to the HV power supply and a drain coupled to a source of the second PFET. The second PFET has a drain coupled to a first resistor where the other end of the first resistor coupled to the ground. The drain of the second PFET is the output of the switch. When the switch is on, the voltage on the gates of both PFETs is dropped to a level to turn on the PFETs but not to violate the maximum terminal-to-terminal voltage of the PFET. In the case of this embodiment, the voltage on the gates of the PFETs is dropped to 5 volts below the HV power supply. This turns on both PFETs providing a low resistance path from the HV power supply to the output of the switch. To turn the switch off, the voltage on the gate of the second PFET is first raised to a level which is just under the maximum terminal-to-terminal voltage of the PFET. In the case of this embodiment, the voltage on the gate of the second PFET is raised to 5 volts. Once the gate on the second PFET is at 5 volts, the voltage on the gate of the first PFET is then raised to the HV power supply turning both PFETs completely off. With both PFETs off, the output of the switch drops to ground through the resistor coupled to ground. To turn on the high voltage switch, the voltage on the gate of the second PFET is first dropped to 5 volts below the HV power supply and then the voltage on the gate of the first PFET is dropped to 5 volts below the HV power supply, turning on both PFETs. This embodiment uses two PFETs to accomplish the high voltage switch without violating the maximum terminal-to-terminal voltage of the PFETs. It will be appreciated that if the maximum terminal-to-terminal voltage is considerably less than 5 volts, additionally PFETs can be added to implement the high voltage switch according to the principles of the present invention.

One aspect of the present invention is that the first power supply is nine volts, the second power supply is five volts, and the ground is zero volt.

Another aspect of the present invention is that the first, second, and third diodes are Schottky diodes. Other diodes with a higher reverse breakdown voltage can be used for the first, second, and third diodes.

A further aspect of the present invention is that the output of the switch circuitry is zero when the switch circuitry is switched off. The input is approximately zero volt when the switch circuitry is switched off.

Additional aspect of the present invention is that the first, second, third, fourth, and fifth resistors can be modified for different voltages of the second power supply (Vccd) and the first power supply (HV).

Still another aspect of the present invention is that the output voltage of the switch circuitry is the same as the first power supply (HV) when the switch circuitry is switched on.

Further another aspect of the present invention is that the bipolar transistor is a NPN transistor.

The present invention is also a disk drive apparatus capable of writing data to a plurality of disks, including: a plurality of write heads capable of writing data to the plurality of disks, respectively; a plurality of write drivers, each of the plurality of write drivers coupled to each of the plurality of write heads, respectively, and enabling/disabling the writing of data to the respective disk; a plurality of switch circuits, each of the plurality of switch circuits coupled to each of the plurality of write drivers, respectively, and being capable of switching on/off at least one of the plurality of write drivers; a controller coupled to the switch circuits and controlling switching on/off each of the switch circuits; and wherein when the controller selects to switch on one of the switch circuits, the respective write driver writes data on the respective disk, an input of the selected switch circuit is approximately a predetermined voltage (Vccd), and an output of the selected switch circuit is higher than the predetermined voltage, e.g. HV.

One aspect of the disk drive apparatus invention is that the predetermined voltage is five volts, and the output of the selected switch circuit is nine volts.

Another aspect of the present invention is that when the controller switches off the selected switch circuit, the input of the selected switch circuit is zero volt, and the output of the selected switch circuit is zero volt.

Still another aspect of the present invention is that the predetermined voltage ranges from 2.8 volts to 5 volts.

Further, the present invention is also a method of writing data in a disk drive apparatus having a plurality of write drivers coupled to a plurality of write heads for writing data to a plurality of disks, each of the plurality of write drivers coupled to a switch circuit, including the steps of: selecting a write driver for writing on a track position of one of the disks; sending a write signal to the respective switch circuit of the selected write driver by a controller; switching on the respective switch circuit of the selected write driver which outputs to the respectively coupled write head a voltage higher than a predetermined input voltage of the respective switch circuit to enable the respective write driver to write data on the respective disk; and writing data on the respective disk via the respective write head.

The present invention also provides a high voltage switch circuit capable of providing an output voltage between ground and a power supply voltage which is higher than a predetermined voltage, including: a first FET device; a second FET device coupled to the first FET device in series between the ground and the first power supply voltage, the second FET having a drain being an output of the switch circuit; a first diode coupled to a gate of the first FET device; a second diode coupled between a source and a gate of the second FET device; a third diode coupled between the first diode and the second diode; a bipolar transistor having a collector coupled to both the first and third diodes; a third FET device coupled between an emitter of the bipolar transistor and the ground, the third FET device having a gate being an input of the switch circuit; and wherein the bipolar transistor controls voltage bias to the diodes and the first and second FET devices.

Other embodiments of an apparatus and method in accordance with the principles of the invention may include alternative or optional additional aspects. For example, the switch circuitry can be configured and arranged to use the NMOS (NFET) instead of the PMOS (PFET). It will be appreciated that other functionally equivalent alternative embodiments of the switch circuitry can be used without departure of the present invention.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a new approach to provide a method and apparatus for high voltage applications with the latest MOSFET technology having low terminal-to-terminal voltages, i.e. the terminal-to-terminal voltage is limited to 5 volts or less. As such, the present invention can operate up to the maximum of N times of a maximum terminal-to-terminal voltage (breakdown voltage) of a single MOSFET (N is the number of MOSFETs used in serial connection, and the maximum terminal-to-terminal voltage is the maximum voltage a single MOSFET can sustain).

Figure 3:
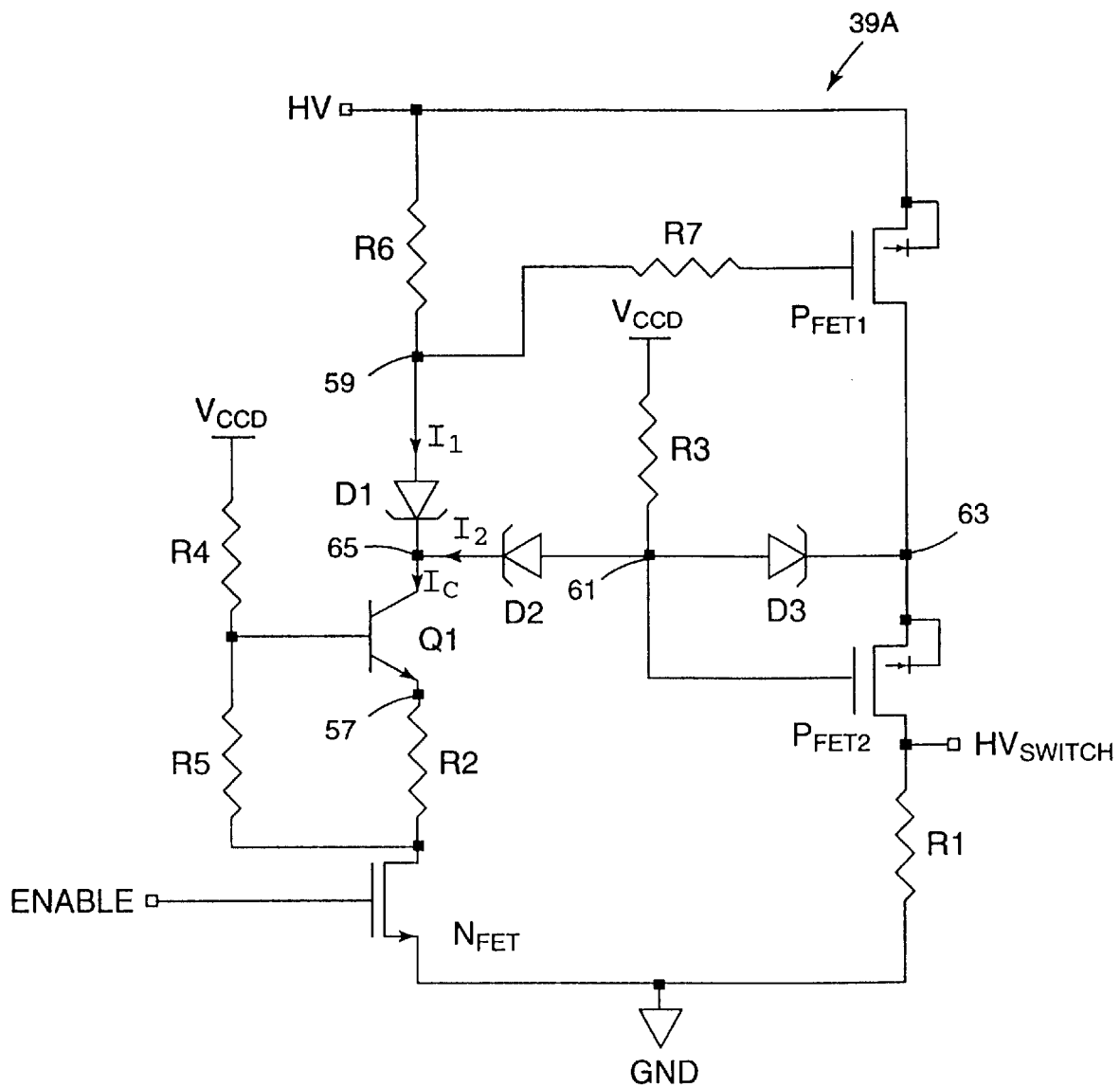
FIG. 3 is a schematic view of the switch circuit of FIG. 1 according to one embodiment of the present invention.

The present invention can also be applied to PFET or NFET based technology. As an example, a PFET based switch circuit is illustrated in FIG. 3 as an example. It will be appreciated to a person skilled in the art to arrange and configure a NFET based switch circuit without departure from the spirit and scope of the present invention.

The applications of the present invention can be used in other types of high voltage applications using the latest MOSFET technology having low terminal-to-terminal voltages, such as less than 5 volts. It will be appreciated to a person skilled in the art that the present invention can be used in other appropriate high voltage applications using further advanced technology which requires an even smaller maximum terminal-to-terminal voltage, such as 2.8 volts, etc.

Figure 1:
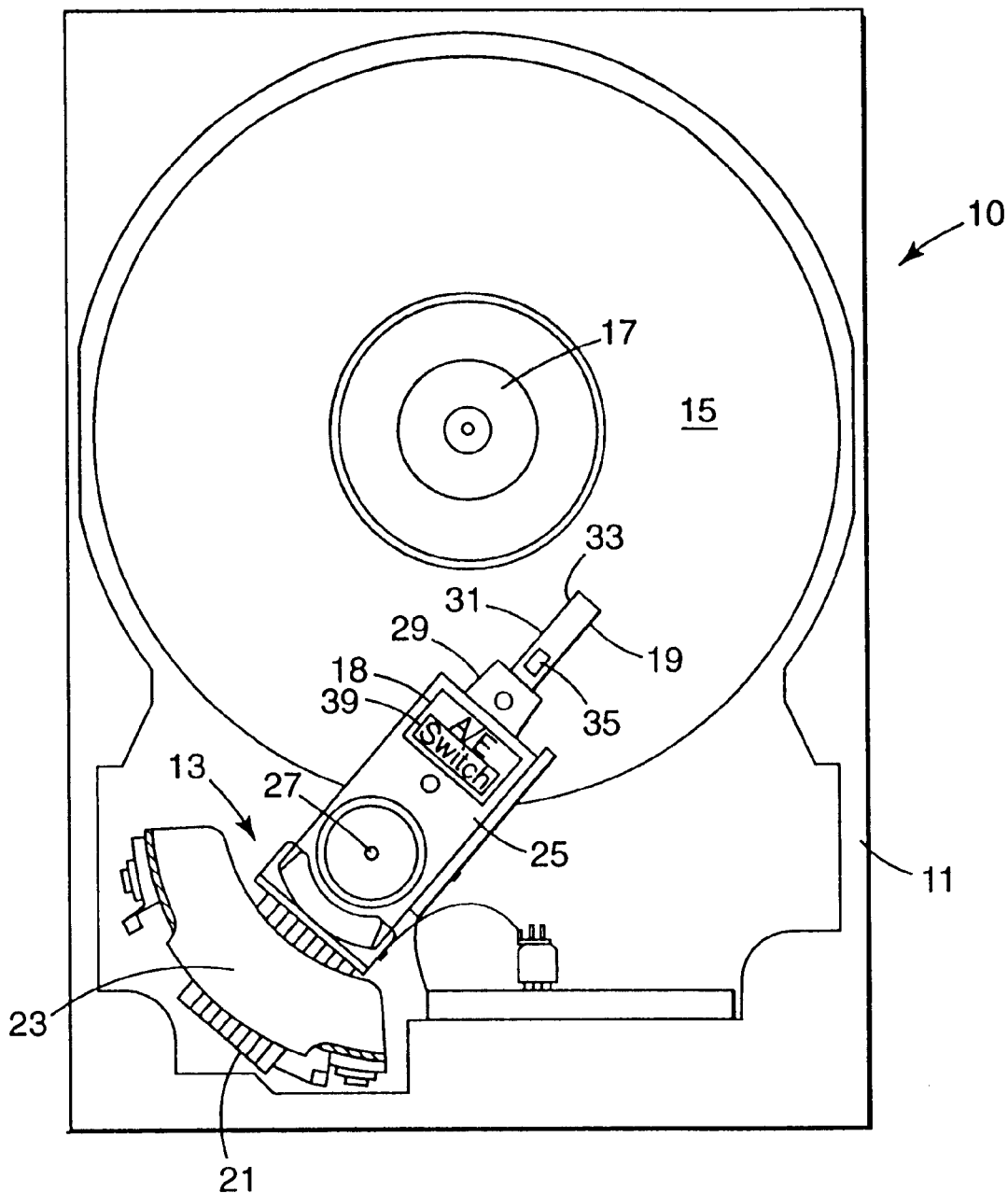
FIG. 1 is a general top plan view of a disk drive apparatus having a switch circuit generally in accordance with the principles of the present invention.

FIG. 1 illustrates a magnetic storage system 10, such as a disk drive, including a housing 11 in which is mounted a rotary actuator 13, one or more associated magnetic storage disks 15 mounted on a spindle 17, and a drive circuitry (not shown) coupled to the spindle 17 for rotating the storage disk 15. The details regarding the drive circuitry are well known to a person skilled in the art, and their particular implementation is not an aspect of the present invention unless expressly noted. The rotary actuator 13 moves a transducer/suspension (usually an integrated transducer/suspension) assembly 19 in accordance with the present invention in an arcuate path across the surface of the storage disk 15.

The rotary actuator 13 includes a voice coil motor comprising a coil 21 movable within the magnetic field of a fixed permanent magnetic assembly 23. An actuator arm 25 having the moving coil 21 formed on one end thereof is pivotably mounted on pivot post 27. A support arm 29 is attached to the other end of the actuator arm 25 and projects across the surface of the storage disk 15. The support arm 29 supports the integrated transducer/slider/suspension assembly 19 produced in cantilever fashion over the surface of the storage disk 15.

The integrated transducer/slider/suspension assembly 19 includes a suspension section 31 and a transducer/slider 33 formed at one end integral with the suspension section 31. The suspension section 31 supports the transducer/slider 33 above the surface of the storage disk 15 on a bearing or cushion of air generated by the rotation of the storage disk 15.

An Arm Electronics (A/E) chip 18 is disposed on the actuator arm 25. The location of the A/E 18 can be varied within the principles of the invention. In one embodiment, the A/E is disposed on the side of the actuator arm 25. The A/E 18 includes a read preamp and a write driver for each head attached to the AE. During a write operation, one of the switch circuits is selected (see FIG. 5, 39a) which will apply the high voltage to the respective write driver. Once enabled by the switch, the write driver sends current to the attached write head writing data onto the storage disk 15.

Figure 5:
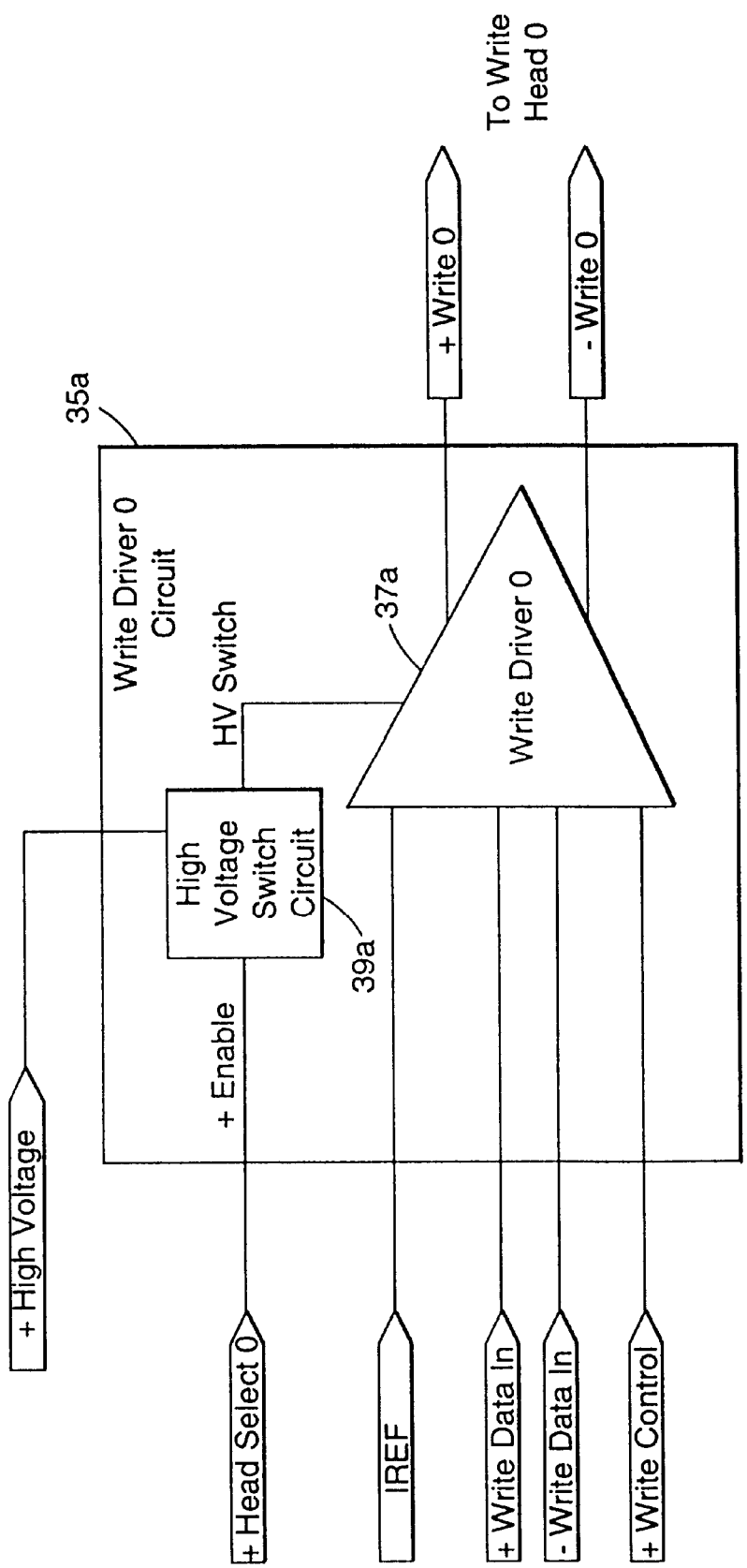
FIG. 5 is a schematic view of a write driver circuit of the disk drive according to one embodiment of the present invention.
Figure 6:
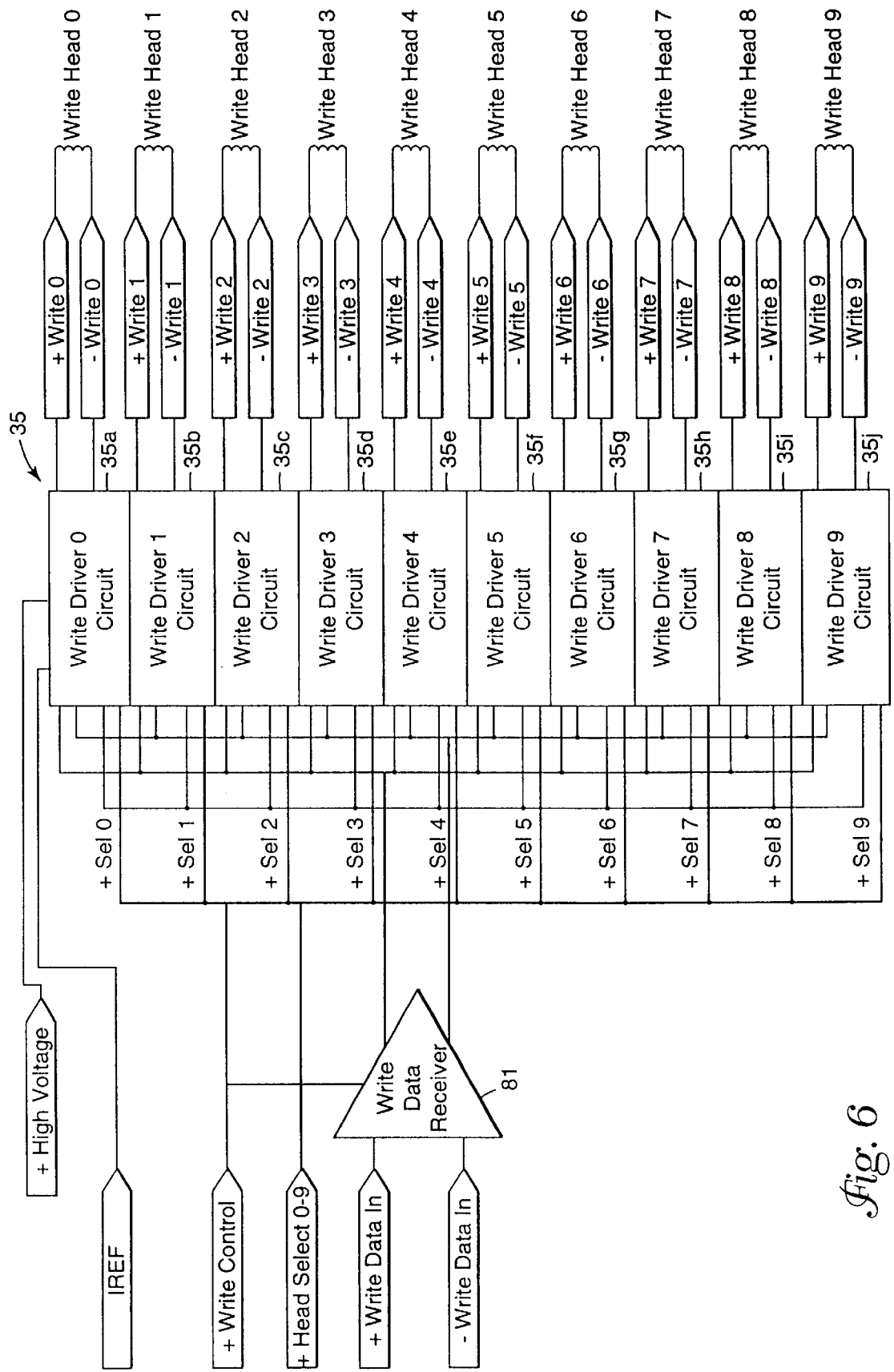
FIG. 6 is a schematic view of a plurality of write driver circuits of the disk drive according to one embodiment of the present invention.

The A/E 18 includes a plurality of switch circuits 39 which selectively enable and disable their respective write driver 37. In one embodiment, the disk drive 10 includes ten write drivers to write data to a plurality of storage disks 15 mounted on the spindle 17 in parallel. In FIG. 6, exemplary ten write driver circuits 35a–35j are generally illustrated. Each of the write driver circuits 35 is coupled to its respective write head. As shown in FIG. 5, each of the write driver circuits 35a includes a write driver 37a and a high voltage switch circuit 39a. When one of the write heads is selected by a controller 41 (see FIG. 2), the high voltage switch circuit 39a is switched on. The high voltage switch circuit 39a has a high voltage output (HV Switch) which enables the write driver 37a. The data from the data channel is then routed to the write head coupled to the write driver 37a.

Figure 2:
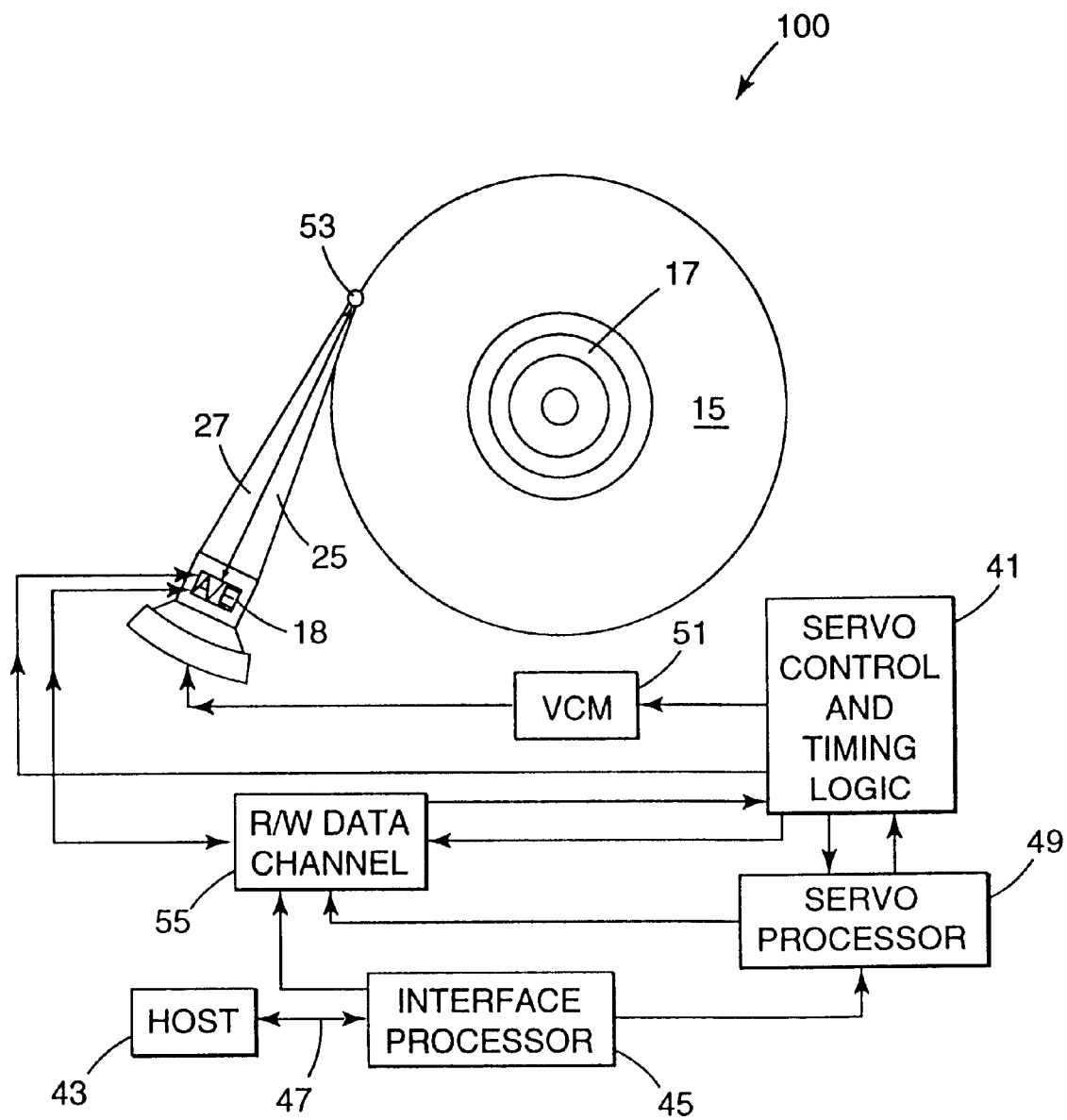
FIG. 2 is a block diagram of the disk drive apparatus according to one embodiment of the present invention.

FIG. 2 illustrates a block diagram of a computer disk drive system 100 which may be suitable for practicing the present invention. It should be understood that the general read/write and servo functions of a disk drive are well-known in the art, and their particular implementation is not an aspect of the present invention unless expressly noted. A host computer system 43 is coupled to an interface processor 45 via a bus 47. The interface processor 45 and the bus 47 link the host computer system 43 to the controller 41 which is often referred to a servo control and timing logic. The host computer system 43 may also be coupled to a data buffer (not shown) which is adapted for temporarily storing microcode and data via the bus 47. It will be appreciated that the host computer system 43 can alternatively be coupled to a data buffer (not shown) remotely located from the driver.

The interface processor 45 is coupled to a servo processor 49. The interface processor 45 may be associated with random access memory (RAM) for storing data and control signals and/or a flash memory or other non-volatile memory for storing program control microcode such as servo operations code, servo design constants, interface processor microcode, and other code utilized in the operation of the disk drive system 100.

The servo processor 49 receives commands across the interface processor 45 and provides control signals to the servo control and timing logic 41. The servo control and timing logic 41 interprets the control signals from the servo processor 49 and sends voice coil control signals to a voice coil motor 51. The voice coil motor 51 drivers the actuator arm 25 in accordance with the control signals. The actuator arm 25 supporting a magnetic head 53 is driven by the voice coil motor 51 to move the magnetic head 53 to a target track position on the storage disk 15. The servo control and timing logic 41 outputs to the servo processor 49 position data indicative of the track position corresponding to the current position of the magnetic head 53 from servo data read out from the storage disk 15. Although the interface and servo processors 45 and 49 are shown in FIG. 2, it will be appreciated that the present invention is not limited to a dual processor environment or the configuration and arrangement illustrated.

Data to be written to the storage disk 15 is routed to a R/W data channel 55. Once the R/W data channel 55 is selected, the data is routed to the magnetic head 53 at the end of the actuator arm 25 for writing to the storage disk 15. The data received from the magnetic head 53 is also routed to the R/W data channel 55 once the channel 55 is selected in a reading operation. Although the R/W data channel 55 is shown in FIG. 2, it will be appreciated that the present invention is not limited to a dual channel environment or the configuration and arrangement illustrated.

Generally, a write operation requires a high voltage to drive the write driver 37. The required voltage is typically higher than five volts, e.g. eight volts or higher. With MOSFET technology, a maximum terminal-to-terminal voltage of a single PFET or NFET is generally five volts.

Applying a higher voltage than five volts to a single FET would cause the FET not to function properly or even breakdown. With disk drive systems advancing to the new technology era, a suitable switch circuit is needed to provide a high voltage for the write drivers in a write operation. The present invention provides for such a high voltage switch circuit used in the disk drive systems. The present invention can also be used in other types of high voltage applications with MOSFET technology.

FIG. 3 illustrates a schematic view of such a switch circuit as above discussed. One of the switch circuits 39, e.g. the switch circuit 39a (see FIG. 5) is coupled between a ground (GND), which is generally zero volt, and a first power supply, High Voltage (HV), which is generally a voltage sufficient to drive a write driver in a write operation, e.g. nine volts. The HV can be modified according to different high voltage applications.

The switch circuit 39a includes a PFET1 and a PFET2 which are two PMOSFETs. Each of the PFET1 and PFET2 has a substrate, a source, a drain, and a gate. PFET1 has its source coupled to the HV, its substrate coupled to the source, and its drain coupled to the source of PFET2. PFET2 has its drain coupled to a first resistor R1 at a first end of the first resistor R1. The second end of the first resistor R1 is coupled to the GND.

The switch circuit 39a also includes a NFET or referred to NMOS. The NFET has a source, a drain, and a gate, wherein its source is coupled to the GND, and its drain is coupled to a second resistor R2 at a first end of the second resistor R2. The switch circuit 39a further includes a bipolar transistor Q1 having an emitter coupled to a second end of the second resistor R2;

The switch circuit 39a also includes a first diode D1 coupled between a first end of a seventh resistor R7 and a collector of the bipolar transistor Q1; a second diode D2 is coupled in an opposite direction to the first diode D1 and coupled between the collector of the bipolar transistor Q1 and the gate of PFET2; and a third diode D3 is coupled in an opposite direction to the second diode D2 and coupled between the gate and the source of PFET2. In one embodiment, the diodes D1, D2, D3 are Schottky diodes. The Schottky diodes are used for their high reverse breakdown voltage. It will be appreciated that other diodes with a similarly high reverse breakdown voltage can be used within the principles of the present invention. It will also be appreciated that other types of electrical devices can be used to replace the diodes without departure from the principles of the invention.

A third resistor R3 is coupled between a second power supply Vccd and the gate of the PFET2. The third resistor R3 is also coupled to a node between the second and third diodes D2 and D3. Typically, Vccd voltage can be a maximum terminal-to-terminal voltage of a single MOSFET, for example, five volts. It will be appreciated that with the size of the MOSFET scaled down for high speed, the maximum terminal-to-terminal voltage of a single MOSFET becomes smaller and smaller. As a result, the Vccd voltage can be reduced accordingly, such as reduced equally, until the PFET1 is in violation. In this case, at least another PFET can be inserted in the switch circuit in accordance with the above discussed embodiment of the invention to properly switch the additional PFET's gate. The Vccd voltage may range from 2.8 to 5 volts. A fourth resistor R4 and a fifth resistor R5 are coupled in serial between Vccd and the drain of the NFET. The base of the bipolar transistor Q1 is coupled to a common node of the fourth resistor R4 and the fifth resistor R5. A sixth resistor R6 is coupled between HV and the first end of the seventh resistor R7. A second end of the seventh resistor R7 is coupled to the gate of PFET1.

The input ENABLE of the switch circuit 39a is the gate of the NFET. The output HV switch of the switch circuitry 39a is the drain of PFET2. ENABLE is the input to control the output HV switch.

In a switching operation, the switch circuit 39a is configured to output a high voltage, such as nine volts. In a switch ON operation, the ENABLE is high, e.g. at five volts level. The NFET is turned on and operated in a linear region. The second resistor R2 and the voltage at node 57 determine the amount of current Ic flowing through the bipolar transistor Q1. Ic is the sum of the currents I1, I2 flowing through the first diode D1 and the second diode D2, respectively. The voltage at node 59 is I1*R6 drop below HV voltage. The voltage at node 61 is I2*R3 drop below Vccd voltage. In this condition, the voltages at node 59 and 61 are approximately the same since they are both one diode above the voltage at node 65. With node 59 having a large enough voltage drop from HV, PFET1 begins to turn on forcing node 63 up towards the HV level. With node 63, the source of PFET2, rising significantly above the gate of PFET2, PFET2 will begin to turn on. As PFET2 turns on completely, both the output of the switch, $HV_{switch}$, and node 63 rise all the way to the HV level. Both PFET1 and PFET2 are fully switched on, providing a low resistance path from HV to the output of the switch, HV switch. Under this condition, the voltage across all four terminals (substrate, source, drain, and gate) of both PFET1 and PFET2 are operated within the maximum terminal-to-terminal voltage constraint.

As ENABLE goes low in a switch OFF operation, e.g. at the GND level, the NFET is turned off. Node 59 rises to HV voltage and node 61 rises to Vccd since there is no Ic passing through the bipolar transistor and NFET. PFET1 begins to turn off as its gate rises to HV. As PFET1 turns off, the voltage at node 63 drops to slightly above Vccd since the gate of PFET2 is at Vccd. Without current flowing through PFET1, PFET2 turns off and the output, $HV_{switch}$, discharges to GND through the resistor R1, i.e., the output is zero volt. The diode, D3, insures that the voltage at node 63 does not drift below a diode below Vccd. Again, all voltages across the four terminals of both PFET1 and PFET2 are operated within the required voltage constraints.

Therefore, the present invention allows PFETs of the switch circuit to operate up to the maximum of two times of the maximum terminal-to-terminal voltage of a single MOSFET. It will be appreciated that N number of PFETs can be used for N times of the maximum terminal-to-terminal voltage of a single MOSFET. Accordingly, it will be appreciated that if MOSFET technology requires a maximum terminal-to-terminal voltage to be as low as three volts, three PFETs can be configured and arranged in series in accordance with the principles of the present invention.

Figure 4:
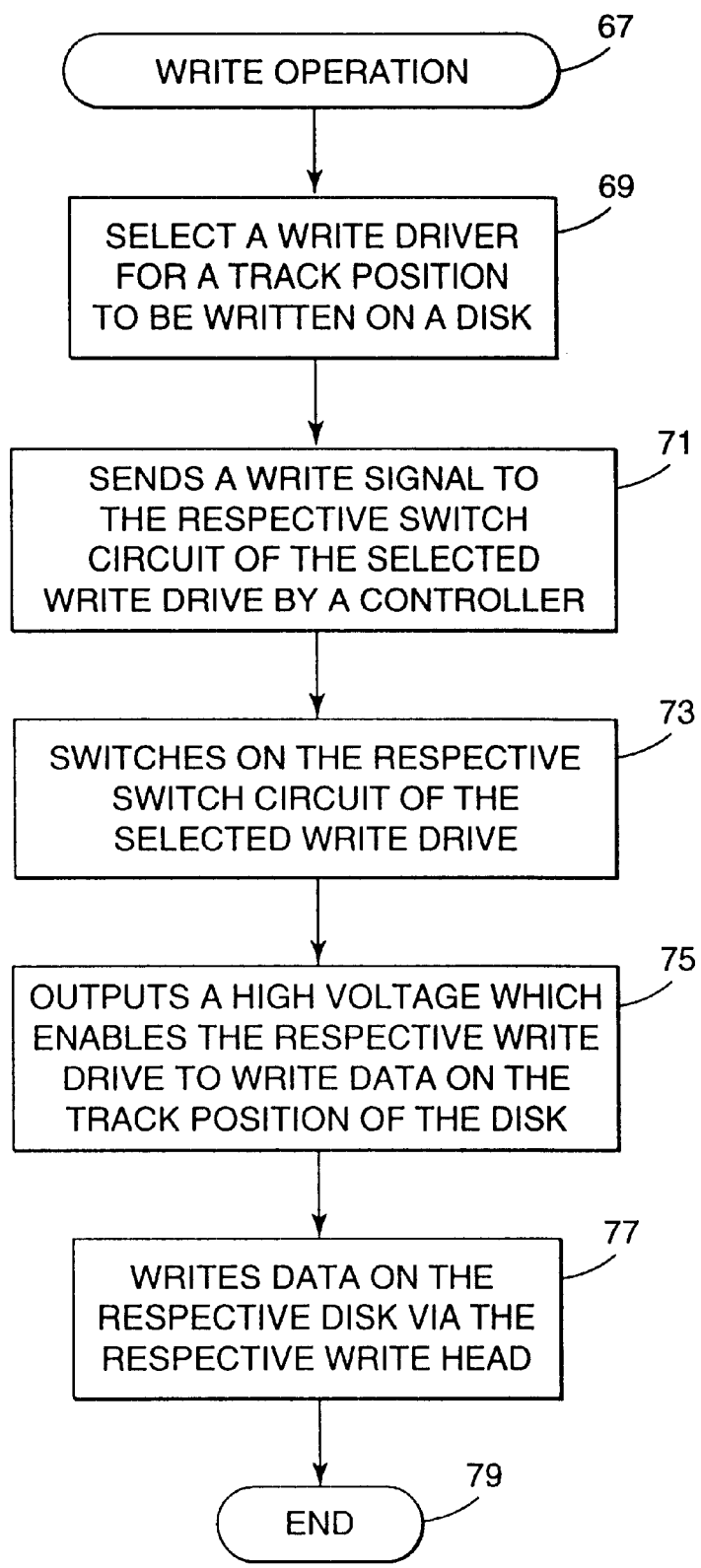
FIG. 4 is a flow chart showing a write operation of the disk drive according to one embodiment of the present invention.

FIG. 4 is a flow chart illustrating a write operation 67 of the disk drive system 100 in accordance with the principles of the present invention. During a write operation, a write driver circuit 35 is selected to write data from the data channel onto a track position of the disk 15 as shown in box 69. A write signal is then sent to the respective switch circuit 39 of the selected write driver circuit 35 by the servo control and timing logic 41 in box 71. The respective switch circuit 39 is then switched on, i.e. ENABLE is high, in box 73. A high voltage, e.g. nine volts, which enables the respective write driver 37 to write data on the track position of the disk 15, is outputted as shown in box 75. Lastly, data is written on the respective disk via the respective write head in box 77. The write operation ends in box 79.

FIG. 5 is a schematic view of one of the write driver circuits 35a of the disk drive system 100 having the respective switch circuit 39a in accordance with the principles of the present invention. Once the respective write head is selected, the HV switch output from the switch circuit 39a enables the write driver 37a to write data waiting at the respective "write data in" to the respective "write head".

FIG. 6 is a schematic view of a plurality of write driver circuits 35 of the disk drive system 100 having their respective switch circuits 39 in accordance with the principles of the present invention. In general, one of the write heads is selected, its respective switch circuit is turned on, and the output, HV switch, enables the respective write driver to write data from the respective "write data in" on the disk via the respective "write head".

The write driver circuit 37 may include a write data receiver 81 which is controlled by a write control such that the data to be written is held at the write data receiver 81 until one of write driver circuits is selected.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A disk drive write driver switch, comprising at least one pair of MOSFET transistors configured to provide a drive voltage to a write driver for turning the write driver on to generate a voltage greater than the terminal-to-terminal breakdown voltage for the MOSFET transistors when in an ON state and for turning the write driver off to generate an voltage near zero when in an OFF state, wherein one of the MOSFET transistors is coupled to a power supply, each of the MOSFET transistors having a gate, the gate of a first of the MOSFET transistors set at a first voltage for the OFF state, the first voltage being approximate to the terminal-to-terminal breakdown voltage of the MOSFET transistors and wherein the gate of the first of the MOSFET pair being set to a second voltage for the ON state, the second voltage being set to a value equal to the power supply voltage less the terminal-to-terminal breakdown voltage of the MOSFET transistors.

2. The disk drive write driver switch of claim 1, wherein the MOSFET transistors are PFET transistors.

3. The disk drive write driver switch of claim 1, wherein the MOSFET transistors are NFET transistors.

4. A disk drive capable of writing data to at least one disk, comprising:

at least one write heads capable of writing data to at least the one disk;

at least one write driver, at least the one write driver coupled to at least the one write head, and enabling/disabling writing of data to at least the one disk; and at least one write driver switch, the at least one write driver switch further comprising at least one pair of MOSFET transistors configured to provide a drive voltage to a write driver for turning the write driver on to generate a voltage greater than the terminal-to-terminal breakdown voltage for the MOSFET transistors when in an ON state and for turning the write driver off to generate an voltage near zero when in an OFF state, wherein one of the MOSFET transistors is coupled to a power supply, each of the MOSFET transistors having a gate, the gate of a first of the MOSFET transistors set at a first voltage for the OFF state, the first voltage being approximate to the terminal-to-terminal breakdown voltage of the MOSFET transistors and wherein the gate of the first of the MOSFET pair being set to a second voltage for the ON state, the second voltage being set to a value equal to the power supply voltage less the terminal-to-terminal breakdown voltage of the MOSFET transistors.

5. The disk drive of claim 4, wherein the MOSFET transistors are PFET transistors.

6. The disk drive of claim 4, wherein the MOSFET transistors are NFET transistors.

7. A method of writing data in a disk drive having at least one write driver coupled to at least one write head for writing data to at least one disk, at least the one write driver coupled to a write driver switch circuit having at least one pair of MOSFET transistors configured to provide a drive voltage to a write driver for turning the write driver on to generate a voltage greater than the terminal-to-terminal breakdown voltage for the MOSFET transistors when in an ON state and for turning the write driver off to generate an voltage near zero when in an OFF state, comprising the steps of:

selecting one of at least the one write driver for writing on a track position of one of at least the one disk;

sending a write signal to the respective write driver switch circuit; and switching on the respective switch circuit by setting a gate of a first of the MOSFET transistors at a first voltage for the OFF state, the first voltage being approximate to the terminal-to-terminal breakdown voltage of the MOSFET transistors and setting the gate of the first of the MOSFET pair being set to a second voltage for the ON state, the second voltage to a value equal to a power supply voltage less the terminal-to-terminal breakdown voltage of the MOSFET transistors.

* * * * *